United States Patent
Berner et al.

(10) Patent No.: US 9,241,416 B2
(45) Date of Patent: Jan. 19, 2016

(54) MODULE ARRANGEMENT

(75) Inventors: Michael Berner, Kirchheim (DE); Ralf Forcht, Wendlingen (DE)

(73) Assignee: FESTO AG & CO. KG, Esslingen (DE)

(*) Notice: Subject to any disclaimer, the term of this patent is extended or adjusted under 35 U.S.C. 154(b) by 211 days.

(21) Appl. No.: 14/001,103

(22) PCT Filed: Mar. 14, 2011

(86) PCT No.: PCT/EP2011/001241
§ 371 (c)(1),
(2), (4) Date: Aug. 22, 2013

(87) PCT Pub. No.: WO2012/122996
PCT Pub. Date: Sep. 20, 2012

(65) Prior Publication Data
US 2013/0329377 A1    Dec. 12, 2013

(51) Int. Cl.
*H05K 7/00* (2006.01)
*H05K 7/02* (2006.01)
*F15B 13/08* (2006.01)
*F16K 27/00* (2006.01)

(52) U.S. Cl.
CPC .............. *H05K 7/02* (2013.01); *F15B 13/086* (2013.01); *F15B 13/0839* (2013.01); *F15B 13/0857* (2013.01); *F15B 13/0867* (2013.01); *F16K 27/003* (2013.01)

(58) Field of Classification Search
USPC ............ 361/679.01, 728–732, 735, 790, 829; 439/928
See application file for complete search history.

(56) References Cited

U.S. PATENT DOCUMENTS

| | | | |
|---|---|---|---|
| 4,469,128 A * | 9/1984 | Petrimaux et al. | 137/554 |
| 5,180,318 A * | 1/1993 | Moller et al. | 439/716 |
| 2006/0011240 A1 * | 1/2006 | Berner et al. | 137/554 |
| 2007/0137708 A1 * | 6/2007 | Kuhbauch et al. | 137/269 |
| 2009/0045363 A1 * | 2/2009 | Kremser et al. | 251/129.04 |

FOREIGN PATENT DOCUMENTS

| | | |
|---|---|---|
| CH | 683012 | 12/1993 |
| DE | 10316129 | 10/2004 |
| EP | 0952359 | 10/1999 |
| WO | WO2007042090 | 4/2007 |

* cited by examiner

*Primary Examiner* — Hung S Bui
(74) *Attorney, Agent, or Firm* — Hoffmann & Baron, LLP (57) ABSTRACT

A module arrangement including a plurality of functional modules lined up in a stacking direction, which are connected to one another for fluidic and electric communication, wherein a functional module includes a plate-shaped base body having two parallel, opposite joining surfaces which are designed to contact joining surfaces of adjacent base bodies, wherein the base body includes a connecting device designed for transferring electric signals and/or electric supply voltages and/or fluid flows between adjacent functional modules along the stacking direction, and wherein several signal lines selectable by the control module extend along the stacking direction of the functional modules for transmitting control signals provided for the direct selection of individual functional modules wherein at least one storage device for detecting, buffering and transferring at least one electric signal of an external component is electrically looped into at least one signal line.

12 Claims, 5 Drawing Sheets

MODULE ARRANGEMENT

This application claims priority based on an International Application filed under the Patent Cooperation Treaty, PCT/EP2011/001241, filed Mar. 14, 2011.

BACKGROUND OF THE INVENTION

The invention relates to a module arrangement comprising a plurality of functional modules lined up in a stacking direction, which are connected to one another for fluidic and electric communication, wherein in each case at least one functional module is designed as a control module for providing and/or processing signals of functional modules lined up therewith and at least one functional module is designed as a valve module for influencing at least one fluid flow and at least one functional module is designed as a signal processing module for processing and/or outputting electric signals from and/or to external components and each of the functional modules comprises a plate-shaped base body having two parallel, opposite joining surfaces the face normals of which determine the stacking direction and which are designed to contact joining surfaces of adjacent base bodies, wherein the base body comprises connecting means designed for transferring electric signals and/or electric supply voltages and/or fluid flows between adjacent functional modules along the stacking direction, and wherein several signal lines selectable by the control module extend along the stacking direction of the functional modules for transmitting control signals provided for the direct selection of individual functional modules.

From EP 0952359 A1, a modular electro-fluidic system comprising modules which can be mounted on a rail and lined up is known. Fluidic modules have headers for actuator connections, while electric modules are provided with bus connections and electric connections for actuators. In addition, at least one interface module is provided which has on one connecting side a first connection configuration with electric and fluidic connections and a contour matched to the modules of the modular system and on the other, opposite, connecting side a second connection configuration differing from the first with electric connections and a contour matched to modules of an external module system which are mounted on the same rail.

CH 683 021 A5 discloses an arrangement comprising a plurality of solenoid valves, which are provided with electric supply lines for the selection of a drive unit via a bus module with a power supply line to a voltage source and a bus signal line to a controller. A decoder module is connected to each valve, and these decoder modules can be connected to the controller or to the bus module by means of a local bus and power supply line, From WO 2007042090 A1, a module system of individual modules which can be arranged side by side in a row is known, which comprises a head module with at least one connection for an external bus signal on an external bus, at least one pneumatic supply connection, an electric supply connection and—each emerging from the same side—a serial bus interface for an internal serial bus, an electric supply interface, a multipole interface and a pneumatic supply interface. There is further provided at least one functional module with each extending continuously from one side to the opposite side and connected to a corresponding interface of the head module—an internal serial bus line, electric supply lines, electric multipole lines and a pneumatic supply line; the head module converts bus signals into multipole signals and outputs them at the multipole interface; the functional module selectively branches off at least one of the multipole lines and, using a signal carried thereon, carries out a pneumatic or electric or both a pneumatic and an electric function.

SUMMARY OF THE INVENTION

The invention is therefore based on the problem of providing a module arrangement which can offer an improved variability in terms of the arrangement and design of the individual functional modules.

According to a first aspect of the invention, this problem is solved for a module arrangement of the type referred to above by the features of claim 1. In this arrangement, it is provided that at least one storage device for detecting, buffering and transferring an electric signal of an external component is electrically looped into at least one signal line between the signal processing module and the control module.

Using the storage device, which, depending on its technical design, can also be referred to as a latch, electric signals of an external component, which may for example be a sensor, can be detected and buffered and transferred via the signal line to the control module at a given point in time which does not necessarily have to correspond to the point in time of the detection of the measured value by the external component.

This allows the at least one electric signal of the external component to be transmitted via the signal lines, the main purpose of which initially is the transmission of control signals provided by the control module to individual functional modules for direct selection. As a simultaneous transmission of control signals on the one hand and electric signals of external components on the other hand poses major problems, it is therefore advantageous to wait, while using buffering by the storage device, for the point in time when the electric signal of the external component can be transmitted to the control module without being affected by control signals which have to be transmitted via the signal line, in particular in the opposite direction. This dual use of the signal line allows for a low-cost structure of the functional modules and the connecting means provided thereon, because the signals to be exchanged between the functional modules, in particular control signals and electric signals from external components, can be transmitted in different directions on a small number of control lines.

In a further embodiment of the invention, the control signals on the one hand and the electric signals from external components on the other hand are carried on discrete signal lines, with the result that any control signals of the control module which may have to be transmitted can be ignored in the transmission of the electric signals from external components. In this embodiment of the invention, the storage device is for example used for the electronic stabilisation of the electric signals from external components, if these are subject to time-related fluctuations which would result in continuous switching between the high level and the low level, in particular in a digital transfer of the electric signals.

Advantageous further developments of he invention are the subject matter of the dependent claims, It is expedient if each of the functional modules is designed as an assembly of the base body and a modular functional unit mounted thereon and designed as an electronic control unit and/or a fluidic control unit and/or a signal processing unit. Together with the base body, the modular functional unit forms the functional module and can be locked to the base body for this purpose. As each functional unit is locked to the corresponding base body, electric and/or fluidic connections are preferably established between the functional unit and the base body. An electronic control unit can for example be used for processing signals from a higher-order data transmission system, such as a bus system, and for transferring these signals to the other functional modules of the module arrangement. The electronic control unit can further make available signals, which are for example provided by the functional modules or by external components connected thereto, to the higher-order data transmission system, in particular using a presettable data protocol. A fluidic control unit can for example comprise one or more in particular electrically selectable valve(s) which may for example be provided for influencing fluidic branch flows of a fluid flow along the stacking direction. The valves may for example be electrically selectable solenoid valves or piezoelectric valves. A signal processing unit can in particular be designed for transferring signals to external components such as electric actuators and/or for processing and transmitting signals from external components such as sensors to a control module. The functional modules can communicate in unidirectional or bidirectional data transmission with adjacent or remote functional modules, in particular control modules, via the signal lines extending in the stacking direction.

In a further development of the invention, it is provided that at least one signal line is connected to a functional module in one end region and has in a second end region an electric branching which is in particular formed in the control module, wherein a first branch of the signal line is electrically connected to a transmitting device located in the control module and a second branch of the signal line is electrically connected to a receiving device located in the control module. On the one hand, such an electric branching in the signal line allows the application of a control signal, for example with electric power for the selection of a solenoid valve, by the control module. On the other hand, it is then possible to transmit an electric signal of an external component, such as a sensor, which is for example connected to a functional module designed as a signal processing unit, to the control module. In this way, the respective signal line which runs through at least one functional module in the stacking direction is used in two ways. As the transmitting device and the receiving device can have very different structures owing to their different functionalities, it is advantageous if the signal line is branched electrically. This allows the transmitting device and the receiving device to be placed in separate locations, thereby ensuring a particularly advantageous structure for these components. It is particularly advantageous if the electric branching is provided in the control module, because in this way the control lines in the lined-up functional modules can be made uniform and the functional modules can be lined up in any preferred sequence.

In a further variant of the invention, it is provided that the receiving device is designed for a status monitoring of a control signal which can be transmitted by the control module to at least one functional module via the signal line. In such a status monitoring process, the receiving device observes the current and/or voltage curve on the signal line and thereby makes it possible to state whether the functional module selected by the control module has adopted the desired state, for example an opening or closing of a valve. In this context, the electric branching of the signal line allows the monitoring of a switching or control command, preferably in real time.

It is advantageous if the transmitting device and the receiving device are coupled to one another by a processing device located in the control module, which processing device is designed such that a transmission of control signals via a signal line and a simultaneous reception of electric signals of an external component on the same signal line are prevented. In this way, it can for example be avoided that the receiving device, which is designed for receiving relatively weak signals from external components, is subjected to a considerably stronger electric signal of the transmitting device, which is for example designed for the selection of a solenoid valve, at a time when the receiving device is ready to receive. As this could possibly involve a faulty input signal at the receiving device or even a malfunction of the receiving device, the processing device ensures that the receiving device is not ready to receive at those times when the transmitting device applies strong electric signals to the signal line.

It is expedient if at least one storage device is designed for detecting, buffering and transferring at least one electric signal of an external component in the control module. In this way, any functional module located in the module arrangement can transfer an electric signal of an external component to the control module for buffering there by means of the storage device and for being passed on for suitable processing at a given point in time.

In a further variant of the invention, it is provided that at least one storage device is designed for detecting, buffering and transferring at least one electric signal of an external component in a functional module. This provides for the assigned signal line a stable electric signal of the external component, which can then be processed in the control module in a simple way. In such a configuration of the respective functional modules, the control module can be made simpler than if the storage device is provided in the control module.

The storage device in the functional module is preferably assigned a selection device which is designed for the selection of those signal lines which are electrically connected to a receiving device located in the control module in order to ensure a signal transmission from the storage device via the selected signal lines. The selection device has the purpose of identifying those signal lines which are connected to receiving devices, in order to transmit the electric signals of external components to the control module exclusively via these control lines. As the signal lines connected to the receiving device in the control module cannot be determined systematically in advance owing to the modularity of the module arrangement, it may for example be provided that, when starting the module arrangement, all transmitting devices are addressed first and corresponding control signals are fed into the lined-up modules via the signal lines, so that the selection device has the opportunity of determining via which signal lines control signals are transmitted. In a subsequent step, the selection device can then autonomously transmit test signals via the control lines identified in the previous step, which are not connected to transmitting devices, in order to confirm then by means of a suitable feedback between the selection device on the one hand and the control module on the other hand that the selected control lines are indeed suitable for transmitting electric signals from external components. A functional module comprising such a selection device is preferably located at the end of the module arrangement. This considerably simplifies data transmission between the functional module with the selection device and the control module.

It is expedient if a reception shaft extending along the stacking direction and housing a replaceable modular electric conducting device through which the signal lines are looped along the stacking direction is provided in the base body. In a dual function, the conducting device is on the one hand used to transfer electric signals which are to be transferred via the signal lines from the preceding functional module to the following functional module. On the other hand, the conducting device is used for the provision of electric signals to the functional module in which the conducting device is located. In this context, it may be provided that the conducting device, in addition to purely electric contacting, also processes signals, in particular with the aid of electric circuits such as amplifiers or digital signal processing devices. The conducting device is preferably designed such that is comprises on one of its two joining surfaces a plug device projecting beyond the joining surface and on the other joining surface a matching recessed socket. The conducting device forms an independent assembly which can be plugged into the base body of the respective functional module in a modular fashion, so that the conducting device can in each case be individually matched to the functionality of the functional module without having to make changes to the base body. In a module arrangement made up of different functional modules, for example, different types of conducting devices are provided to match the respective functionality of the different functional modules. A first conducting device may for example be provided for control modules, a second embodiment of a conducting device for valve modules and a third embodiment for signal processing modules.

In an advantageous further development of the invention, it is provided that in the electric conducting device an offset of the signal lines is provided at right angles to the stacking direction by an integral multiple of the pitch of adjacent signal lines in order to form an electric Z-interconnection of the signal lines, Using such a Z-interconnection of signal lines, the desired modularity of the functional modules with the electric conducting device housed therein can be implemented by simple means. If it is for example provided that, starting from one control module, a total of ten signal lines are provided for the direct selection of individual functional modules, and if it is further provided that each of the lined-up functional modules receives a control signal via a single signal line, a total of ten functional modules can be selected via the Z-interconnection without having to rely on complex contacting measures, because, owing to the offset of the control lines, exactly that control line which is assigned to the respective functional module terminates in each functional module.

In the base body, there is preferably formed a recess oriented at right angles to the stacking direction and starting from the reception shaft, which recess allows an electric coupling between the conducting device and the associated functional module. The recess in the base body enables the functional module to be directly coupled into the conducting device without requiring any intermediate contacting, which would for example have to be integrated into the base body, so that these measures enhance the contact security between the functional module on the one hand and the conducting device on the other hand.

According to a second aspect of the invention, the problem on which the invention is based is solved by providing that a serial bus system is provided for data transmission between the control module and the at least one signal processing module, and that the signal processing module is provided with coupling means designed for coupling signals of the external components into the serial bus system and/or for coupling signals to the external components out of the serial bus system. In this way, the electric signals of the external components can be directly coupled into the serial bus system or signals for transmission to the external components can be coupled out of the serial bus system. As a result, the serial bus system can in a dual function on the one hand be used for the serial provision of control signals to functional components, wherein these control signals have to be made available via the serial bus system to a suitably designed functional module in order to convert the serial bus signals into bus signals for the individual functional modules. On the other hand, the serial bus system is used for direct data communication between external components and the control module.

BRIEF DESCRIPTION OF THE DRAWINGS

Advantageous embodiments of the invention are shown in the drawing, of which.

DETAILED DESCRIPTION OF THE PREFERRED EMBODIMENTS

Figure 1:
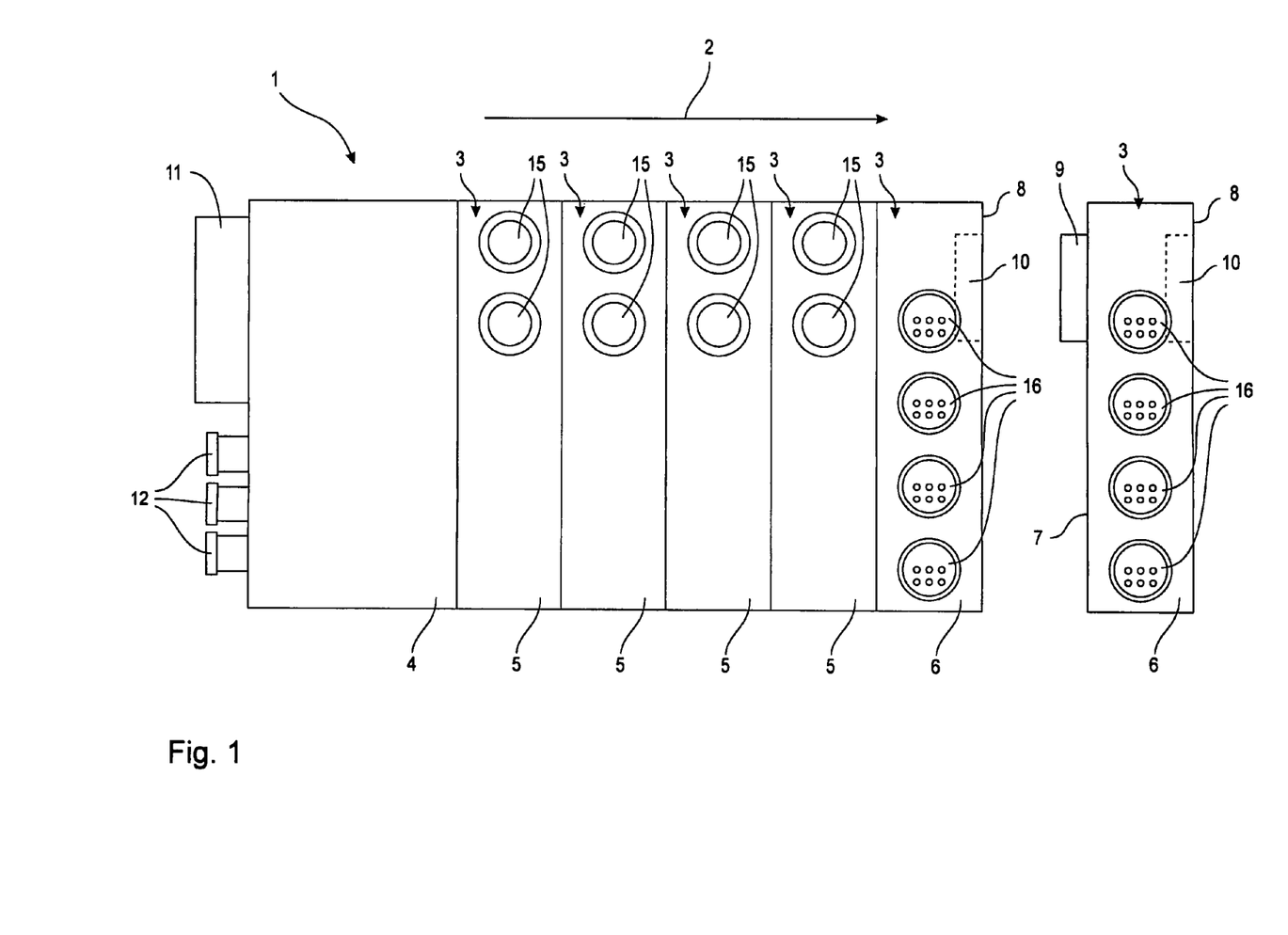
FIG. 1 is a diagrammatic representation of a module arrangement constructed of a plurality of functional modules lined up with one another.
Figure 2:
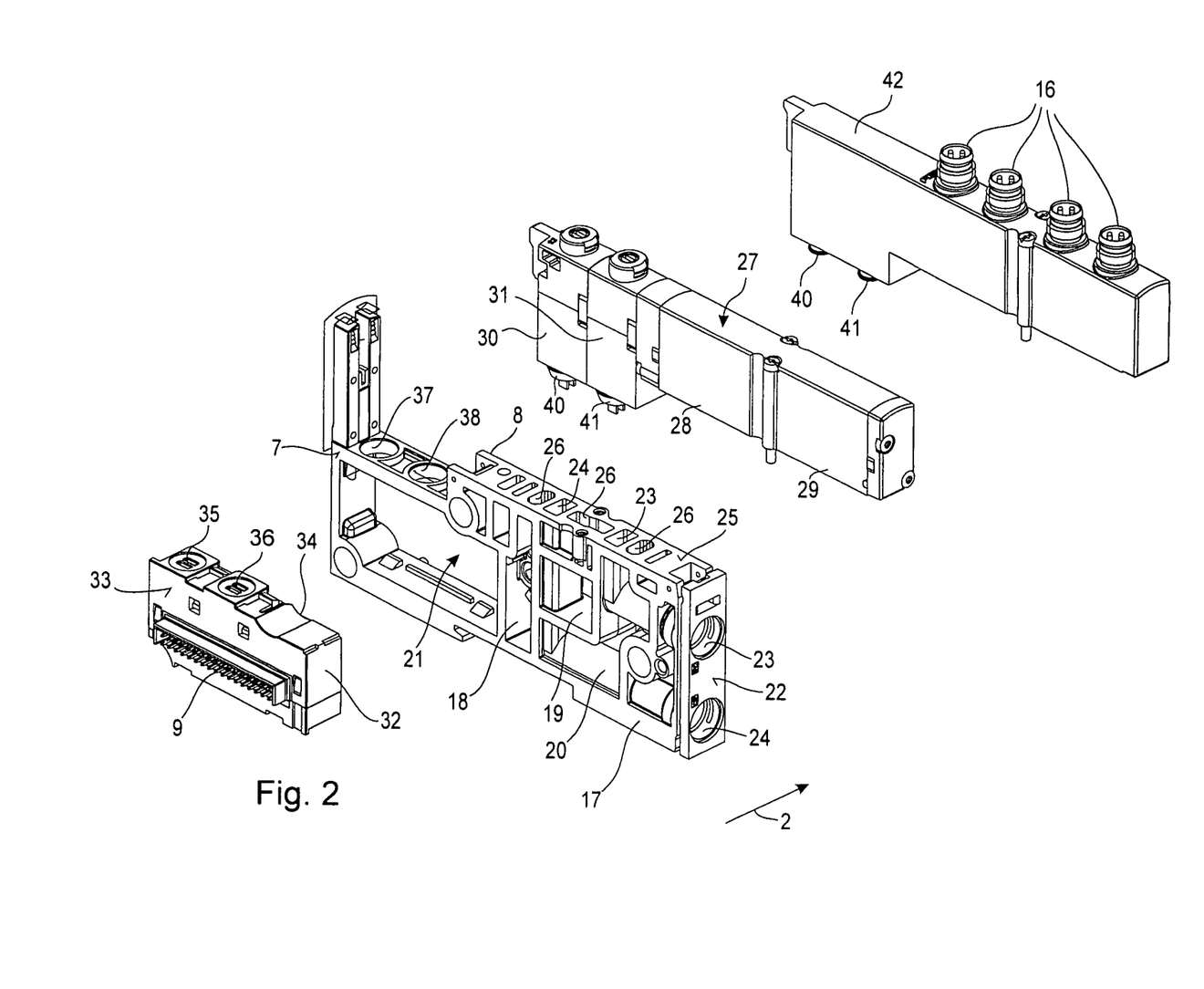
FIG. 2 is a perspective view of various components of a functional module which can be combined with one another.

A module arrangement 1 as shown in FIG. 2 comprises a plurality of functional modules 3 lined up in a stacking direction 2. In the illustrated embodiment, three different types of functional modules 3 are provided, these being a control module 4, several valve modules 5 and several signal processing modules 6. The control module 4 is designed for coupling the lined-up valve modules 5 and signal processing modules 6 to a higher-order data transmission system, for example a field bus, which is not shown in the drawing. For this purpose, the control module 4—as will be described in greater detail later—has several components capable of processing signals, in order to transfer the data provided by the higher-order data transmission system to the valve modules 5 and the signal processing modules 6. The control module 4 further comprises components for processing electric signals from external components not shown in the drawing, which are connected to the signal processing modules 6, and for transferring these signals to the higher-order data transmission system. Each of the functional modules 3 has two opposite joining surfaces 7, 8; these are for example indicated on the signal processing module 6, which is ready for mounting on the functional modules 3 which are already lined up along the stacking direction 2. The joining surfaces 7, 8 are geometrically matched, being flat in the illustrated embodiment, and allow surface contact between adjacent functional modules 3. In the illustrated embodiment, the separated signal processing module 6 is with its first joining surface 7 brought into surface contact with the second joining surface 8 formed on the preceding signal processing module 6. For electric coupling, each of the functional modules has a plug 9 on the first joining surface 7, which can be inserted into a socket 10 indicated by broken lines on the second joining surface 8, in order to connect the signal lines of the respective functional modules 3, which will be described in greater detail later, to one another.

The control module 4 has a bus port 11 for accommodating a bus plug not shown in the drawing, via which bus plug electric signals of the higher-order data transmission system can be made available to the control module 4 and output signals of the control module 4 can be transmitted to the higher-order data transmission system. The control module is further provided with several fluid supply ports 12 for coupling the control module 4 to at least one fluid source not shown in the drawing, for example a compressed air source.

In the illustrated embodiment, at least one fluid flows centrally through all functional modules 3 along the stacking direction 2 by way of the fluid supply ports 12.

The valve modules 5, which will be described in greater detail later, have fluid outlets 15, to each of which can for example be connected a compressed air hose for supplying the compressed air provided by the valve module 5 to an actuator not shown in the drawing. On each of the signal processing modules 6, signal plugs 16 are formed for an electric connection between external components not shown in the drawing, such as sensors, and the module arrangement 1.

The exploded view of FIG. 2 shows by way of example various components from which a functional module 3 can be constructed, A central function is fulfilled by the base body 17, through which pass several fluid passages 18, 19 and 20 as well as a reception shaft 21 and which provides the joining surfaces 7, 8 for lining up preceding and following base bodies 17. When several base bodies 17 are lined up along the stacking direction 2, several fluid passages extending along the stacking direction 2 are formed, allowing a central supply and, if required, a central discharge of operating fluid such as compressed air for the whole module arrangement 1. Two operating passages 23, 24, which can be provided with plug-in connectors for coupling compressed air hoses without the use of tools, terminate on one end face 22 of the base body 17. The end sections of the operating passages 23, 24 which are remote from the end face 22 terminate at a mounting surface 25 of the base body 17. Transverse passages 26 which are each connected to one of the fluid passages 18 to 20 for communication likewise terminate at this mounting surface 25.

The end sections of the operating passages 23, 24 which terminate at the mounting surface 25 can intermittently be brought into communicating fluidic connection with one another by valve means 28, 29 which can be mounted on the mounting surface, for example in order to direct a fluid flow from one of the fluid passages 18 to 20 into one of the operating passages 23 or 24 or vice versa. For this purpose, the valve means 28, 29 are provided with valve members and associated valve seats not shown in the drawing, wherein the valve members of the illustrated embodiment can be moved between an open position and a closed position by electromechanical actuating means 30, 31, in particular coil drives.

To supply the actuating means 30, 31 with electric energy, the reception shaft 21 of the base body 17 can contain a conducting device 32 of a cartridge-type design, which is provided with the connecting means designed as a plug 9 on a first side surface 33 and with a socket corresponding to the plug 9 but not visible in FIG. 2 at another side surface 34 opposite the side surface 33. The conducting device 32 is geometrically coded, so that it can only be inserted into the reception shaft 21 of the base body 17 in a single configuration. After the conducting device 32 has been inserted into the reception shaft 21 of the base body 17, two sockets 35, 36 of the conducting, device 32, which are substantially perpendicular to the side surfaces 33, 34, come to overlap recesses 37, 38 formed in the base body 17. Through these recesses 37, 38, suitably designed plugs 40, 41 formed on the actuating means 30, 31 can be inserted into the sockets 35, 36 to establish an electric connection between the actuating means 30, 31 and the conducting device 32.

Similarly designed plugs 40, 41 are provided on the functional unit designed as a signal processing unit 42. These allow an electric communication between the conducting device 32 and the electric circuit not shown in the drawing, which is accommodated in the signal processing unit 42 and is provided for communication with the external components not shown in the drawing, which can be connected at the signal plugs 16.

Depending on the application of a functional module 3, the base body 17 can be equipped with a suitable functional unit, for example the valve unit 27 or the signal processing unit 42, as well as with a suitably designed conducting device 32, so that the module arrangement can be designed extremely flexibly, not only in terms of the functional modules 3 which can be lined up, but also in terms of the design of such functional modules 3.

Figure 3:
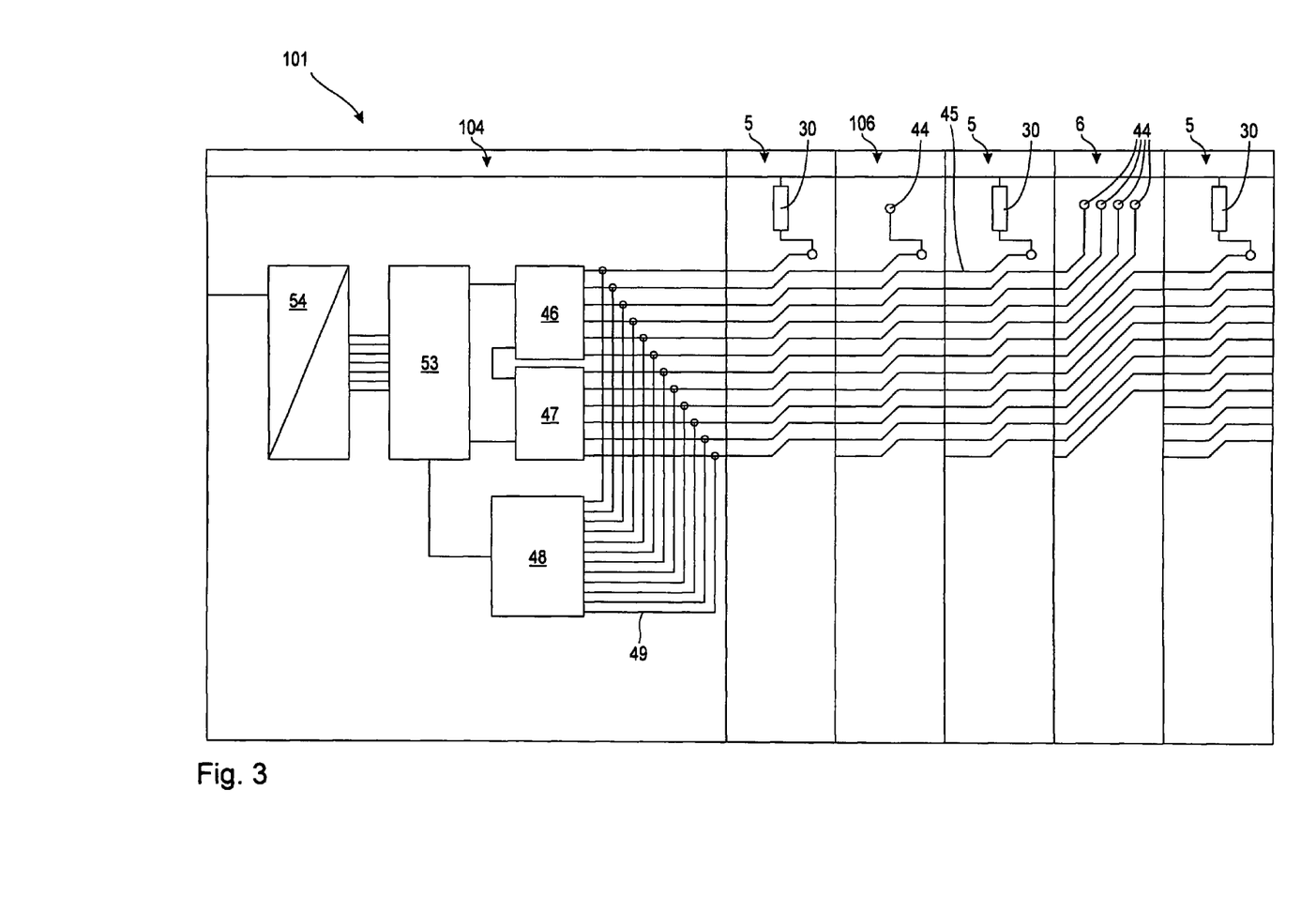
FIG. 3 is a first circuit diagram for the electric interconnection of functional modules according to a first embodiment.
Figure 4:
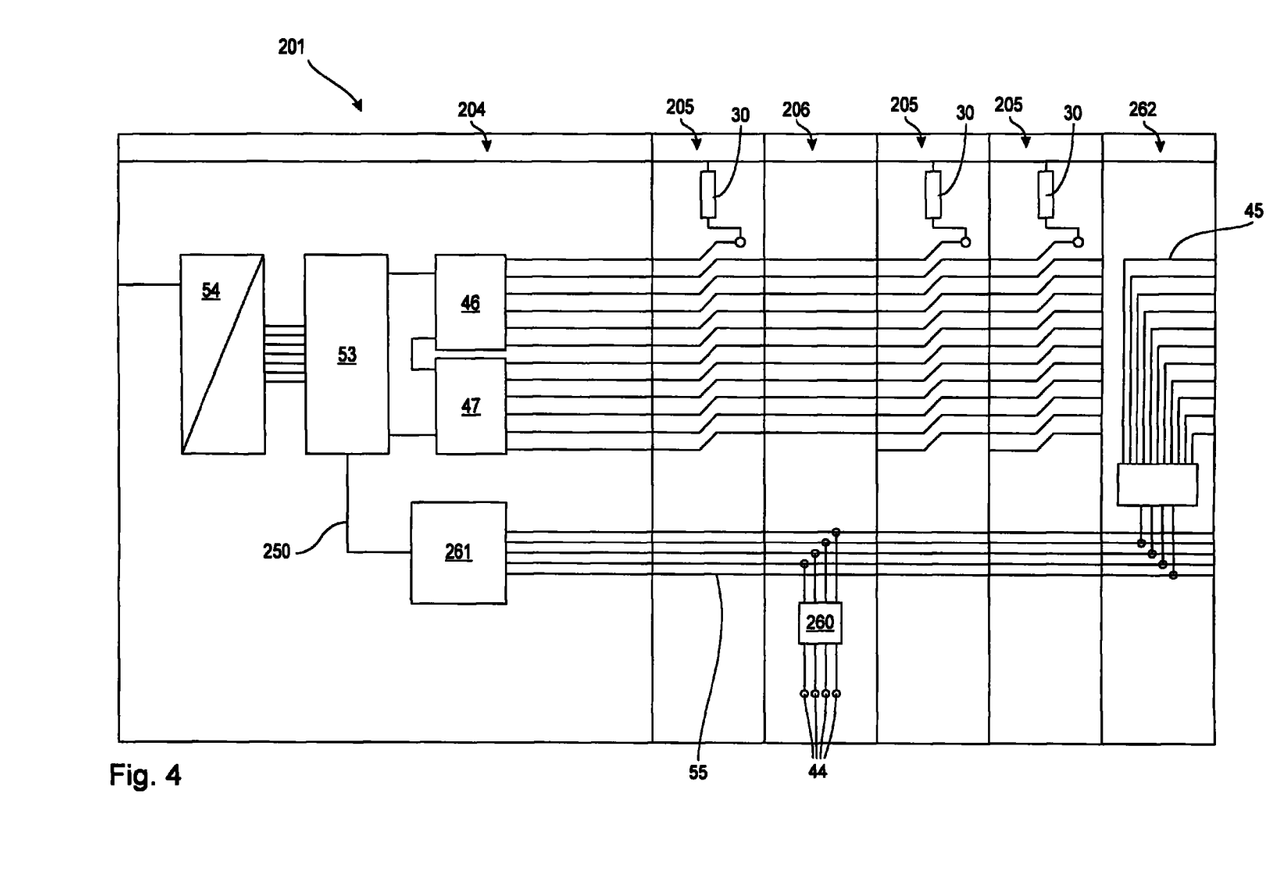
FIG. 4 is a circuit diagram for the electric interconnection of functional modules according to a second embodiment.
Figure 5:
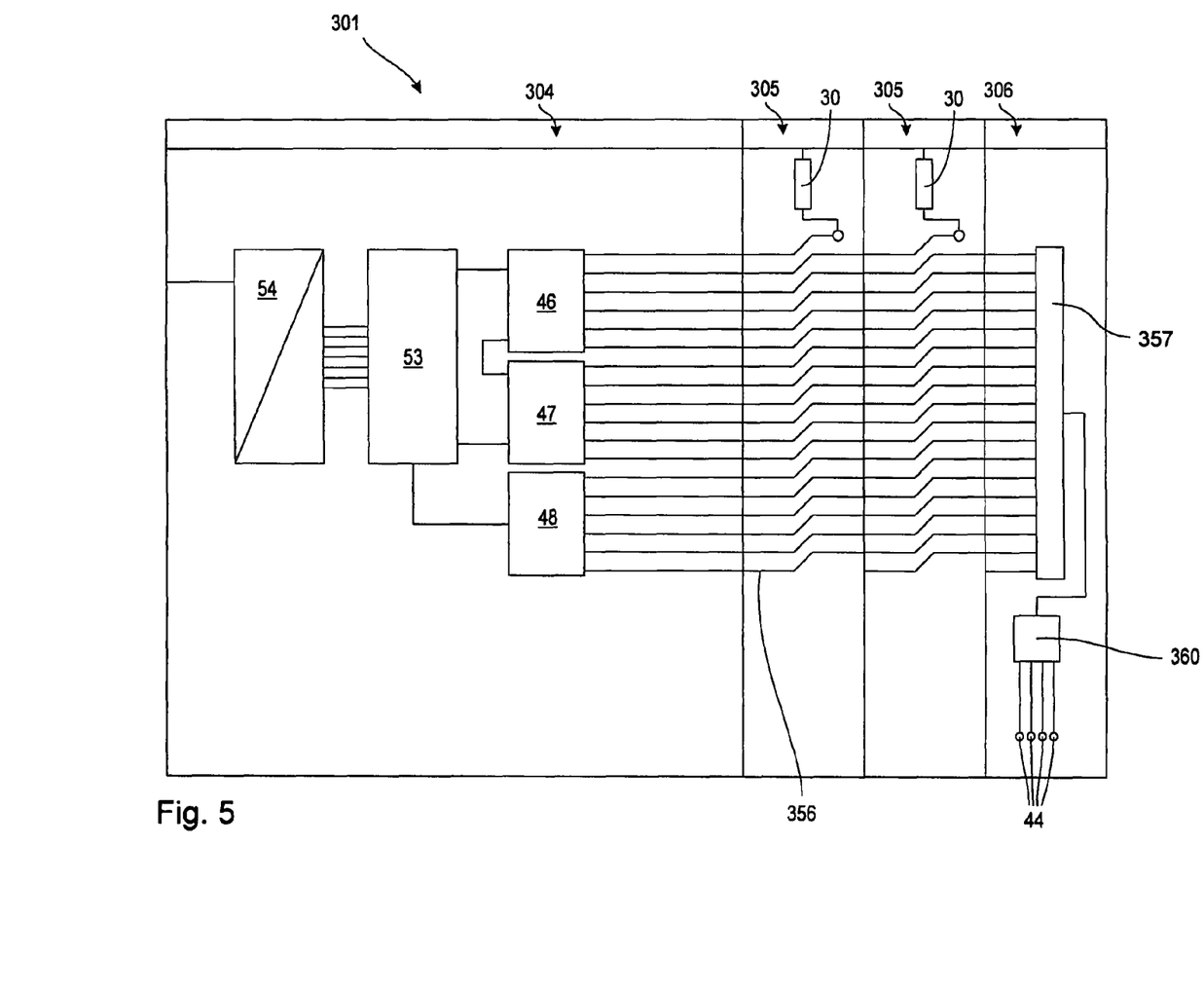
FIG. 5 is a circuit diagram for the electric interconnection of functional modules according to a third embodiment

FIGS. 3 to 5 show various embodiments of module arrangements 101; 201; 301, components of equal function being identified by the same reference numbers.

In the first embodiment of a module arrangement 101 according to FIG. 3, the functional modules 3 can be lined up with the control module 104 in any sequence preferred. In the illustrated embodiment, three valve modules 5 and a signal processing module 6 and a signal processing module 106 are provided. For clarity, each of the valve modules 5 comprises only one actuating means 30. The signal processing module 106 is designed such that it can be connected to an external component not shown in the drawing, such as a sensor. The external component is coupled to the signal processing module 106 via a signal plug not shown in the drawing, and the electric signal of the external component is made available to a node 44 of a signal line 45 via a connecting line. The signal line 45 is looped through the preceding functional modules 3 in the manner of a Z-interconnection.

In the control module 104, the signal line 45 branches and is electrically connected to one of the transmitting devices 46, 47 on the one hand and to a receiving device 48 on the other hand. In the illustrated embodiment, the transmitting devices 46, 47 are designed as coil drivers which can supply electric energy to the connected actuating means 30 via the signal lines 45. The receiving device 48 is connected to each of the signal lines 45 via branch lines 49 and can tap and process electric signals running against the stacking direction 2 from the corresponding signal lines 45.

The receiving device 48 may for example be a buffer memory also known as a latch which, on the arrival of a signal via the respective signal line 45 and the branch line 49, can be switched to a preset state and transfer this switching state via at least one communication line 50 to a processing module 53, such as a microprocessor or a microcontroller. In this process, the processing module 53 is in communicating connection with a protocol module 54, which may for example be a bus controller which may be designed for communication with a data bus not shown in the drawing, i.e. with a higher-order communication device.

In contrast to the signal processing module 106, the signal processing module 6 is designed for the connection of several external components and therefore has several nodes 44. As a total of four signal lines 45 are looped out of the Z-interconnected signal lines 45 in the signal processing module 6, the remaining signal lines 45 have to be offset by four times the geometric pitch between adjacent signal lines 45, in order to ensure a faultless communication between the control module 104 and the functional modules 3 lined up behind the signal processing module 6 in the stacking direction 2. The signals at the nodes 44 are transferred to the receiving device 48 via the signal lines 45 and the branch lines 49 in the same way as in the case if the signal processing module 106, in order to be processed and then transferred to the processing module 53 via the communication line 50. In this embodiment of a module arrangement 101, it is advantageous that the signal processing modules 6, 106 can be installed at any point between the other functional modules 3, because all signal lines 45 can be monitored by the receiving device 48 owing to the branching in the control module 6, so that corresponding sensor signals can be received on the signal lines 45. In a further development of the invention not shown in the drawing, the receiving device is also designed as a transmitting device for transmitting data via the signal lines to the external components.

In the second embodiment of a module arrangement 201 according to FIG. 4, a serial bus system having five data lines in the illustrated embodiment, extending parallel to the stacking direction 2 and looped through all functional modules 3 is provided in addition to the signal lines 45. In the signal processing module 206 of the module arrangement 201, a buffer memory 260 is provided which is designed to couple electric signals of external components which are not shown in the drawing, and which are connected to the node 44 into the data lines 55 of the serial bus system. In addition, the buffer memory 260 may also be designed for coupling out electric signals transmitted on the data lines 55, for processing them if required and for transferring them to external components not shown in the drawing. For selecting the serial bus system and the associated data lines 55, a suitable internal bus controller 261, which is coupled to the processing module 53 via at least one communication line 250, is provided in the control module 204. In this embodiment of the module arrangement 201, it is advantageous that actuating means 30 can be selected directly via the signal lines 45, while the signals of external components are made available to the processing module 53 via the data lines 55 of the bus system and the bus controller 261. For a dual function, the serial bus system may be designed such that, in addition to the electric signals of external components, it transmits in particular digital control signals for actuating means 30, 31, which signals can be offered to suitable signal lines 45 in a suitably designed coupling module 262, so that the module arrangement 201 is not restricted by the number of available signal lines 45.

In the embodiment of a module arrangement 301 shown in FIG. 5, Z-interconnected connecting lines 356 running parallel to the signal lines 45 are likewise provided in addition to the signal lines 45. Both the signal lines 45 and the connecting lines 356 are connected to a selection module 357. The selection module 357 is electrically coupled to a buffer memory 360, which in the illustrated embodiment in turn has four connections for external components not shown in the drawing. The selection module 357 has the purpose of identifying among the connected lines those which, as connecting lines 356, are directly connected to the processing module 53, because a direct data communication is possible between the external components and the processing module 53 via these connecting lines 356. For this purpose, it may for example be provided that, on starting the module arrangement 301, control signals can initially be output via the signal lines 45 by means of the processing module 53 and of the transmitting devices 46, 47 coupled thereto, and these signals can then either be output via the signal lines 45 and made available to actuating means 30 coupled thereto or detected in the selection module 357. Those lines via which control signals are made available to the selection module 357 are identified as signal lines 45 by the selection module 357 and are therefore not used for data transmission between external components and the processing module 53. On the other hand, those lines which do not make available any control signals to the selection module 357 can be categorised as connecting lines 356 for data communication between the external components, the interposed receiving device 48 and the processing module 53. As the assignment of signal lines 45 may differ depending on which signal processing module 306 is lined up as the last functional module 3 in the module arrangement 301 and which functional modules 3 are installed in line with the control module 304, the selection module 357 is provided for identifying the lines which are not used for signal transmission, in order to establish data communication between the external components and the processing module 53.

The invention claimed is:

1. A module arrangement comprising a plurality of functional modules lined up in a stacking direction, which are connected to one another for fluidic and electric communication, wherein in each case at least one functional module is designed as a control module for providing and/or processing signals of functional modules lined up therewith and at least one functional module is designed as a valve module for influencing at least one fluid flow and at least one functional module is designed as a signal processing module for processing and/or outputting electric signals from and/or to external components and each of the functional modules comprises a plate-shaped base body having two parallel, opposite joining surfaces the face normals of which determine the stacking direction and which are designed to contact joining surfaces of adjacent base bodies, wherein the base body comprises connecting means designed for transferring electric signals and/or electric supply voltages and/or fluid flows between adjacent functional modules along the stacking direction, and wherein several signal lines selectable by the control module extend along the stacking direction of the functional modules for transmitting control signals provided for the direct selection of individual functional modules, wherein at least one storage device for detecting, buffering and transferring an electric signal of an external component is electrically looped into at least one signal line between the signal processing module and the control module.

2. The module arrangement according to claim 1, wherein each of the functional modules is designed as an assembly of the base body and a modular functional unit mounted thereon and designed as an electronic control unit and/or a fluidic control unit and/or a signal processing unit.

3. The module arrangement according to claim 1, wherein at least one storage device is designed for detecting, buffering and transferring at least one electric signal of an external component in the control module.

4. The module arrangement according to claim 1, wherein at least one storage device is designed for detecting, buffering and transferring at least one electric signal of an external component in a functional module.

5. The module arrangement according to claim 4, wherein the storage device in the functional module is assigned a selection device which is designed for the selection of those signal lines which are electrically connected to a receiving device located in the control module in order to ensure a signal transmission from the storage device via the selected signal lines.

6. The module arrangement according to claim 1, wherein a reception shaft extending along the stacking direction and housing a replaceable modular electric conducting device through which at least the signal lines are looped along the stacking direction is provided in the base body.

7. The module arrangement according to claim 6, wherein, in the electric conducting device, an offset of the signal lines is provided at right angles to the stacking direction by an integral multiple of the pitch of adjacent signal lines in order to form an electric Z-interconnection at least for the signal lines.

8. The module arrangement according to claim 6, wherein a recess oriented at right angles to the stacking direction and starting from the reception shaft is formed in the base body, which recess allows an electric coupling between the conducting device and the associated functional unit.

9. The module arrangement according to claim 1, wherein a serial bus system is provided for data transmission between the control module and the at least one signal processing module, and wherein the signal processing module is provided with coupling means designed for coupling signals of the external components into the serial bus system and/or for coupling signals to the external components out of the serial bus system.

10. A module arrangement comprising a plurality of functional modules lined up in a stacking direction, which are connected to one another for fluidic and electric communication, wherein in each case at least one functional module is designed as a control module for providing and/or processing signals of functional modules lined up therewith and at least one functional module is designed as a valve module for influencing at least one fluid flow and at least one functional module is designed as a signal processing module for processing and/or outputting electric signals from and/or to external components and each of the functional modules comprises a plate-shaped base body having two parallel, opposite joining surfaces the face normals of which determine the stacking direction and which are designed to contact joining surfaces of adjacent base bodies, wherein the base body comprises connecting means designed for transferring electric signals and/or electric supply voltages and/or fluid flows between adjacent functional modules along the stacking direction, and wherein several signal lines selectable by the control module extend along the stacking direction of the functional modules for transmitting control signals provided for the direct selection of individual functional modules, wherein at least one storage device for detecting, buffering and transferring an electric signal of an external component is electrically looped into at least one signal line between the signal processing module and the control module, and wherein at least one signal line is connected to a functional module in a first end region and has in a second end region an electric branching which is formed in the control module, wherein a first branch of the signal line is electrically connected to a transmitting device located in the control module and a second branch of the signal line is electrically connected to a receiving device located in the control module.

11. The module arrangement according to claim 10, wherein the receiving device is designed for a status monitoring of a control signal which can be transmitted by the control module to at least one functional module via the signal line.

12. The module arrangement according to claim 10, wherein the transmitting device and the receiving device are coupled to one another by a processing device located in the control module, which processing device is designed such that a transmission of control signals via a signal line and a simultaneous reception of electric signals of an external component on the same signal line are prevented.

* * * * *